United States Patent [19]
Ichihara et al.

[11] Patent Number: 5,253,110
[45] Date of Patent: Oct. 12, 1993

[54] ILLUMINATION OPTICAL ARRANGEMENT

[75] Inventors: Yutaka Ichihara; Yuji Kudo, both of Yokohama, Japan

[73] Assignee: Nikon Corporation, Tokyo, Japan

[21] Appl. No.: 981,946

[22] Filed: Nov. 24, 1992

Related U.S. Application Data

[63] Continuation of Ser. No. 830,507, Jan. 31, 1992, abandoned, which is a continuation of Ser. No. 630,870, Dec. 20, 1990, abandoned.

[30] Foreign Application Priority Data

Dec. 22, 1988 [JP] Japan .................................. 63-322190
Dec. 21, 1989 [JP] Japan .................................. 1-329690
Mar. 5, 1990 [JP] Japan .................................. 2-51900

[51] Int. Cl.$^5$ .................................................. G02B 27/00
[52] U.S. Cl. .................................. 359/619; 359/370; 359/371; 359/385; 359/386; 359/577; 359/591; 362/268; 362/259
[58] Field of Search ............... 362/259, 268, 299, 300, 362/301, 307–309; 350/167, 402; 355/67; 359/496, 577, 619, 385, 591, 386, 370, 371

[56] References Cited
U.S. PATENT DOCUMENTS 4,109,304  8/1978  Khvalovsky .................. 362/259
4,370,026  1/1983  Dubroeucq et al. ............ 362/259
4,619,508  10/1986  Shibuya et al. ............... 362/268
4,851,978  7/1989  Ichihara ....................... 350/167
4,964,707  10/1990  Hayashi ........................ 350/402
5,016,149  5/1991  Tanaka et al. ................. 350/167

Primary Examiner—Georgia Y. Epps
Attorney, Agent, or Firm—Michael N. Meller

[57] ABSTRACT

An illumination optical arrangement which uses a laser light source to produce a uniform illumination which is high in brightness and substantially free of interference patterns. The illumination optical arrangement includes light source means for emitting a coherent light beam, optical illuminance distribution uniformizing means for making substantially uniform the intensity distribution in a beam cross-section of illumination by the coherent light beam on a plane to be illuminated, and optical polarizing means for producing from the coherent light beam a plurality of polarized light components which are different in polarized state from each other in such a manner that wavefronts of incident light beams of the polarized light components to the optical illuminance distribution uniformizing means are inclined relative to each other whereby interference patterns produced by the polarized light components are relatively shifted in position in the illuminated plane.

18 Claims, 6 Drawing Sheets

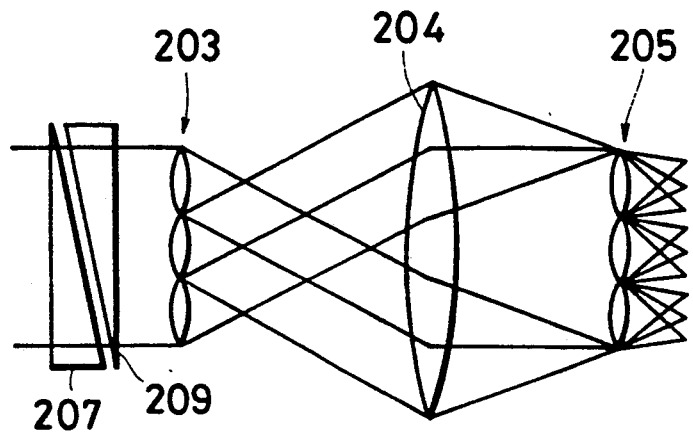
F I G. 7
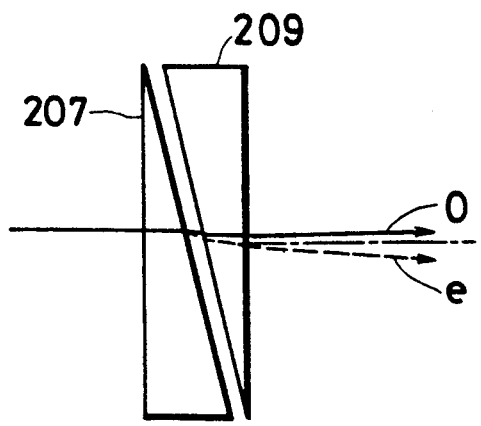
F I G. 8

ILLUMINATION OPTICAL ARRANGEMENT

This application is a continuation of application Ser. No. 830,507, filed Jan. 31, 1992, now abandoned, which is a continuation of application Ser. No. 630,870, filed Dec. 20, 1990, now abandoned.

BACKGROUND OF THE INVENTION

1. Field of the Invention

The present invention relates to an illumination optical arrangement employing a laser light source to produce high brightness illumination which is substantially free of any interference patterns, and more particularly the invention relates to an illumination optical arrangement suitable for example for an exposure apparatus used in the fabrication of semiconductor integrated circuits such as VSLIs.

2. Description of the Prior Art

In an apparatus for effecting the photolithography used for the manufacture of semiconductor integrated circuits, e.g., VSLIs, it is necessary to effect uniform illumination of high brightness, and generally a super-high pressure mercury lamp is frequently used for such illumination.

However, due to the recent trend toward higher degree of integration of VSLIs, a greater linewidth accuracy than previously is presently demanded for the photolithography.

As a result, the use of a short wave high-output laser such as an Excimer laser has begun to come into use in place of the super-high pressure mercury lamp.

There have been known various types of Excimer laser light sources including a so-called stable resonance type which emits a laser light which is comparatively low in temporal and spatial coherence, a so-called injection lock type which emits a laser light which is higher in temporal and spatial coherence than the stable resonance type and their modified types. However, the use of any of there types of laser light sources produces more or less spot-like illumination irregularities (interference patterns) due to the interference of the laser light.

In order to eliminate such interference patterns, U.S. Pat. No. 4,619,508 discloses a method in which the light beam is two-dimensionally scanned by a rotating mirror or the like arranged in the optical path of an illuminating system so that the spatial coherence of the light beam is substantially reduced and the interference pattern is reduced.

U.S. Pat. No. 4,851,978 granted to the inventors on Jul. 25, 1989 discloses that where a light source of the injection lock type which emits a laser beam of high temporal and spatial coherence is used, in order that any interference patterns caused in the illumination may be effectively eliminated by the vibrations of the beam, it is necessary to two-dimensionally oscillate the light beam as many times as corresponding to the number of lens elements of a fly-eye lens or the like arranged to make uniform the beam intensity distribution in the illumination system in synchronism with the laser light pulses.

In any case, however, to spatially vibrate the laser beam so as to eliminate the interference patterns as mentioned previously requires that the light beam is two-dimensionally oscillated a considerable number of times by a vibration mirror or the like during the exposure period and therefore there is the disadvantage that the exposure time must be made considerably long with the resulting considerable decrease in the production efficiency of semiconductor devices.

Moreover, the conventional methods cannot ensure the complete elimination of any interference patterns even if the light beam is oscillated a considerable number of times and they impede the formation of finer patterns of integrated ciucuits ever tending toward the realization of higher integration.

SUMMARY OF THE INVENTION

It is an object of the present invention to provide an illumination optical arrangement employing a coherent light source such as a laser and more particularly an illumination optical arrangement capable of easily eliminating any interference patterns from an illuminated plane without two-dimensionally vibrating the laser beam.

It is another object of the present invention to provide such illumination optical arrangement which additionally utilizes the two-dimensional vibration of a laser beam thereby more effectively attaining the elimination of interference patterns.

It is still another object of the present invention to provide an illumination optical arrangement which can always accurately detect an exposure quantity without changing a reflection factor of a half mirror in an optical system even if the polarized condition of a light beam from a light source is changed.

In accordance with one aspect of the present invention, the above objects are accomplished by an illumination optical arrangement including light source means for emitting a coherent light beam, optical illuminance distribution uniformizing means for substantially making uniform the intensity distribution in a beam cross-section of the illumination by the coherent light beam in a plane to be illuminated, and optical polarizing means for producing from the coherent light beam a plurality of types of polarized light components which are different in polarized condition from each other and for inclining the wavefronts of incident light of the polarized light components to the optical illuminance distribution uniformizing means relative to each other such that interference patterns due to the polarized light components are shifted in position relative to each other in said plane.

In accordance with another aspect of the present invention, there is provided an illumination optical arrangement comprising an optical integrator for forming groups of a plurality of real or virtual secondary light sources spatially and periodically distributed in a flat plane at the right angle to a beam optical axis from a coherent light beam emitted from a light source, lens means for overlapping a plurality of luminous fluxes from said secondary light sources on a single plane to be illuminated, and optical polarizing means for producing from the coherent light beam a pair of polarized luminous fluxes of which inner product of respective polarizing vectors is zero and polarizing said polarized luminous fluxes to be entered into said optical integrator with different polarizing angles to each other so that interference patterns caused by said polarized luminous fluxes are relatively deviated in position on said single plane to be illuminated, characterized in that particularly for achieving the aforementioned object, said optical integrator is formed from a fly-eye lens including a parallel arrangement of a plurality of positive or negative lens elements having incident and exit planes in the form of a right-angle tetragon respectively, and that said optical polarizing means has an optical construction parameter so determined that where a and b (a≦b) are the dimensions of the length of two sides of said tetragon, a difference angle between the polarizing angles of said two polarized luminous fluxes is given by $$\theta = \lambda\{[(n+\tfrac{1}{2})/a]^2 + [(m+\tfrac{1}{2})/b]^2\}^{\tfrac{1}{2}}$$

wherein λ represents the wavelength, n and m represent the integer, and when said fly-eye lens is viewed in a direction of said optical axis, said difference angle between the polarizing angles is formed at an angle ψ expressed by:

$$\psi = \tan^{-1}\{[(n+\tfrac{1}{2})/a]/[(m+\tfrac{1}{2})/b]\}$$

with respect to said b.

The aforesaid optical integrator is constituted by a fly-eye lens in which a plurality of positive or negative lens elements having a right-angle puadrilateral incident and exit planes of which lengths of two sides adjacent to each other are a and b, (a≦b) respectively, are arranged in parallel. The aforesaid optical construction parameter of the optical polarizing means is determined so that the difference angle θ between the polarizing angles of the two polarized luminous fluxes and a direction formed by said difference angle θ (angle formed with respect to the side of said b when said fly-eye lens is viewed in the direction of the optical axis), which constitute the conditions for optimizing the complemental smoothing of light intensity distribution at said single plane to be illuminated, are fulfilled with the following formulas:

$$\theta = \lambda \cdot \{[(m+\tfrac{1}{2})/a]^2 + [(m+\tfrac{1}{2})/b]^2\}^{\tfrac{1}{2}}$$

wherein a and b (a≦b) represent the lengths of two sides adjacent to each other of the tetragon constituting incident and exit planes of the lens elements of the fly-eye lens, λ represents the wavelength of the beam used, and n and m represents the integer, on the basis of the succeeding parameter of the fly-eye lens arranged in the optical path and the wavelength of the beam, and $$\psi = \tan^{-1}\{[(n+\tfrac{1}{2})/a]/[(m+\tfrac{1}{2})/b]\}$$

The optical polarizing means can be realized, for example, merely by arranging a polarizing prism having a predetermined shape formed of a birefringent optical material in an optical path. Thereby, interference patterns in the illuminated plane can be substantially eliminated without vibrating the laser beam.

Particularly, in the case where the coherent light beam from the light source has the polarizing characteristic, a polarizing prism formed of a birefringent optical crystalline material having an optical axis at an angle of 45 degrees with respect to the polarizing direction is used whereby the polarizing prism may have a function for overcoming the polarization of the source light beam. That is, the light passing through the birefringent crystal imparts a phase difference to an ordinary ray (o polarized light) and an extraordinary ray (e polarized light) of polarized lights, and therefore acts as a so-called wavelength plate.

In this case, the polarizing prism is not uniform in its thickness in the overall surface but different in thickness according to locations through which light passes, and therefore, the passed light beam is different in the polarized condition according to the passing locations and the incident light beam receives a false polarization overcoming effect.

In accordance with the present invention, utilizing the fact that an interference pattern in an illuminated plane has a periodic construction corresponding to the construction of the illuminance distribution uniformizing means in the illumination system, the laser beam is separated for example into two polarized light components which are perpendicular to each other and also the interference patterns formed on the illuminated plane by the polarized light beams are displaced by half period from each other so that the interference patterns compensate each other thereby eliminating the interference patterns on the illuminated plane.

The optical polarizing means can be realized by simply arranging for example a polarizing element such as a birefringent crystal prism of a given shape in the optical path and thus the interference patterns in the illuminated plane can be substantially eliminated without vibrating the laser beam.

Also, where the coherence of the light from the light source is considerably high, the vibration of the laser beam by a vibration mirror or the like may be additionally used in combination so that the interference patterns on the illuminated plane can be eliminated with greater efficiency or the reduced number of beam vibrations.

If such illumination optical arrangement is used for example with an exposure apparatus for manufacturing integrated circuits, it is possible to form finer circuits without deteriorating the production efficiency and thus the arrangement has a very great utility.

The above and other objects, features and advantages of the present invention will become more apparent from the following description of its preferred embodiments taken in conjunction with the accompanying drawings.

BRIEF DESCRIPTION OF THE DRAWINGS

FIG. 7 is an optical path diagram of the principal part in the case employing a pair of fly-eye lenses.

FIG. 8 is an optical path diagram useful for explaining the correction of the direction of travel of the beam after passing through the birefringent crystal prism.

DESCRIPTION OF THE PREFERRED EMBODIMENTS

Figure 1:
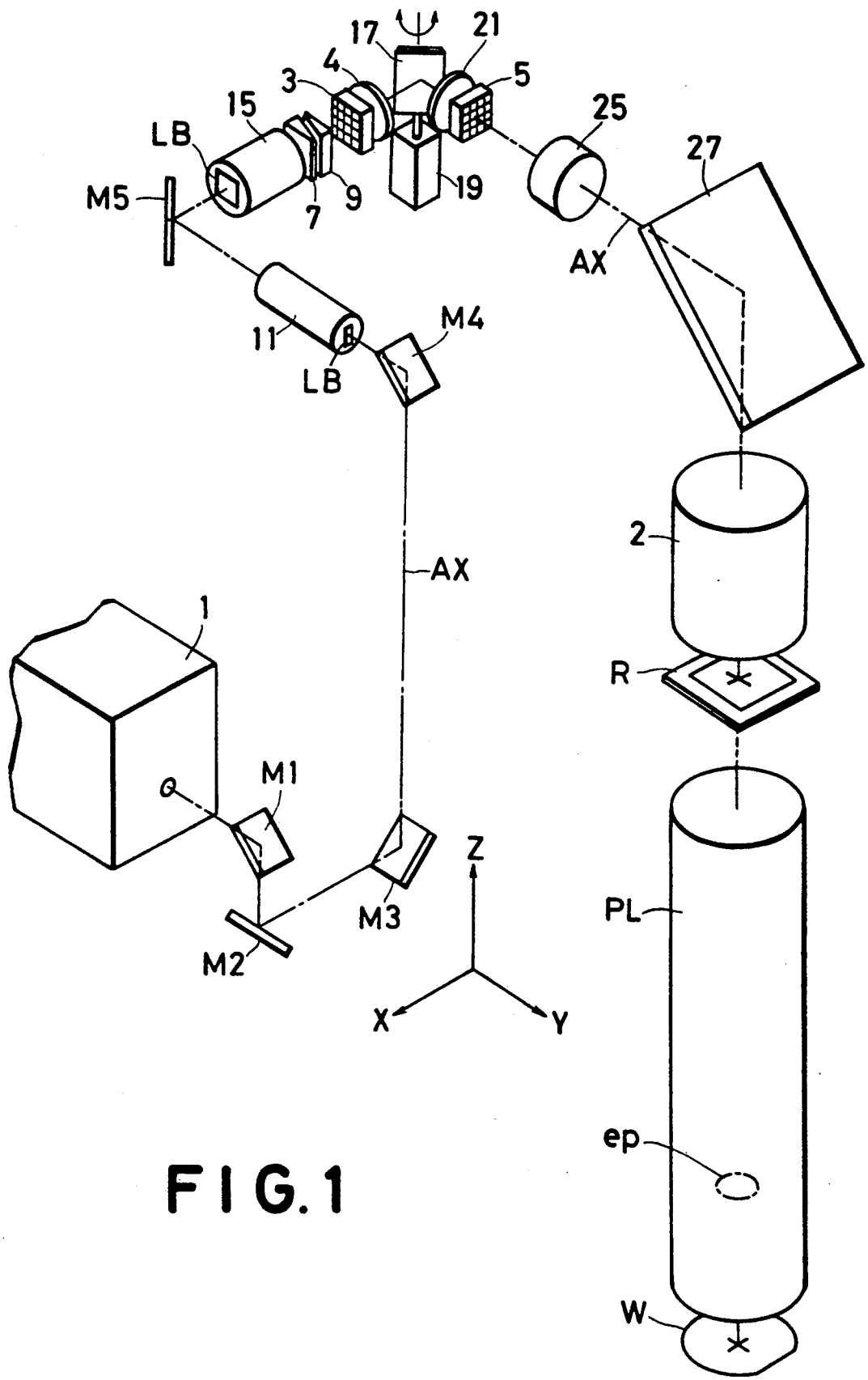
FIG. 1 is a schematic diagram showing the optical construction of a projection exposure apparatus according to an embodiment of the present invention.

FIG. 1 shows an illumination optical arrangement according to an embodiment of the present invention which is applied to a projection exposure apparatus for projecting the pattern on a reticle onto a semiconductor wafer.

Figure 2:
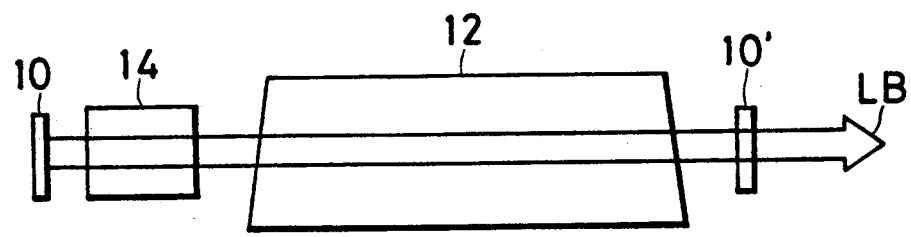
FIG. 2 is a schematic diagram showing the construction of the light source in the embodiment of FIG. 1.

Firstly, as shown schematically in FIG. 2, in this embodiment a laser light source 1 is a KrF Excimer laser light source of the stable resonance type including a discharge tube 12 for producing an induced emission, resonator mirrors 10 and 10' respectively arranged at the ends of the discharge tube 12 and a wavelength selecting element 14, e.g., an etalon, diffraction grating or prism which is disposed between the discharge tube 12 and the resonator mirror 10. The laser beam emitted from this light source 1 features that the provision of the wavelength selecting element 14 has the effect of decreasing the spectral width (the temporal coherence is improved) and decreasing the spatial coherence as compared with the injection locking type. While the present invention is not limited to any particular light source, it is preferable to use a light source of the construction as shown in FIG. 2 in view of the fact that no color aberration correction is required for the projection lens PL of the exposure apparatus and that the contrast of the interference patterns produced is essentially so low that the interference patterns can be easily eliminated completely.

Then, the laser beam LB emitted from the laser light source 1 is directed to a cylindrical lens 11 through ultra-violet reflecting mirrors $M_1$, $M_2$, $M_3$ and $M_4$ each of which bends the optical path and the cross-sectional shape of the beam LB is reshaped from the oblong rectangular to the square-like shape.

Thereafter, the optical path of the beam LB is bent by an ultra-violet reflecting mirror $M_5$ so that it is directed to a beam expander 15 which in turn expands it to a desired beam diameter. The expanded beam emerging from the beam expander 15 enters a birefringent crystal prism 7 forming optical polarizing means. The crystal prism 7 has its edge lind formed into a wedge shape with its vertex angle of 1° 35' in the same plane as the crystal optical axis of itself so that the incidnet beam is separated into two types of polarized light components whose wavefronts are inclined by about 64" with respect to each other and they emerge from the prism 7. The vertex angle of the crystal prism 7 is suitably selected in accordance with the wavelength of the laser beam LB, and the pitch of the element lenses of the fly-eye lenses 3 and 5 and the magnification due to lenses 4 and 21 which follow it.

Then, these two polarized beams are directed to a silica glass prism 9 arranged to face the crystal prism 7 at their inclined surfaces for correcting purposes and having a vertex angle of 1°50' (this value is also selected suitably in accordance with the degree of refraction of the beam by the birefringent crystal prism arranged at the preceding stage) and the prism 9 corrects the two polarized beams in such a manner that the direction of travel of each of the polarized beams forms an angle of about 32" (=64"/2) with the optical axis A of the illumination system on both sides of the axis A.

Then, the two polarized beams are transmitted through the first-stage fly-eye lens 3 so that a plurality of secondary light sources separated from each another are formed on the exit side of the fly-eye lens 3. After the light beams from the secondary light sources have been bent by a vibration mirror 17 (the light beams need not be vibrated and may be left stationary if the light source shown in FIG. 2 is used as will be described later) through a convex lens 4, the beams are passed through another convex lens 21 so as to enter in a superposed manner into the second-stage fly-eye lens 5. After the superposed beams have been separated again into a plurality of beams for illuminance distribution uniformization purposes by the fly-eye lens 5, the beams are again condensed in a similar manner by a lens 25, bent by a mirror 27 and directed to a main condenser lens 2. In this way, the laser beam composed of the two polarized light components subjected to the illuminance uniformization action is suitably condensed by the main condenser lens 2 and a reticle R is illuminated uniformly. As a result, the circuit pattern on the reticle R is projected onto a wafer W through the projection lens PL thereby effecting the exposure.

In this case, if the optical polarizing means composed of the crystal prism 7 is not arranged, interference patterns are produced on the object to be illuminated or the reticle R by the fly-eye lenses 3 and 5 as mentioned previously so that the interference patterns are projected, along with the circuit pattern on the reticle R, onto the wafer W, thus impeding the transcribing of an excellent pattern.

In accordance with the present invention, by virtue of the fact that the coherent light beam emitted from the light source 1 is separated into two polarized beams forming the desired angles by the optical polarizing means (the crystal prism 7 in the present embodiment) thereby illuminating the reticle R, the polarized beams produce interference patterns which are shifted in the period of light and dark by a half period so that the two interference patterns compensate each other and consequently the interference patterns are eliminated.

While, in the above-described embodiment, the light source as shown in FIG. 2 is used which emits a laser light beam having a relatively low spatial coherence (the contrast of an interference pattern is essentially low), the degree of coherence differs with different light sources and there are cases where the light source of the same type may have a considerably higher coherence depending on the manufacturer. In such a case, it is difficult to completely eliminate the interference patterns by simply arranging the crystal prism 7 and thus the vibration mirror 17 shown in FIG. 1 can be vibrated during the exposure so that the interference patterns are reciprocated in the illuminated plane to ensure a uniform illuminance and thereby eliminate the interference patterns by an integration effect. Even in such a case, as compared with the case involving only the vibration of the beam, the arrangement of the birefringent crystal prism in combination with the vibration mirror is extremely advantageous in that the interference patterns are eliminated with a greater efficiency (with the reduced number of vibrations) and the production efficiency of the photolithographic process is improved.

Where the optical polarizing means is not provided, the generation of interference patterns in the illuminated plane is caused as will be explained with reference to FIGS. 3 and 4.

Figure 3:
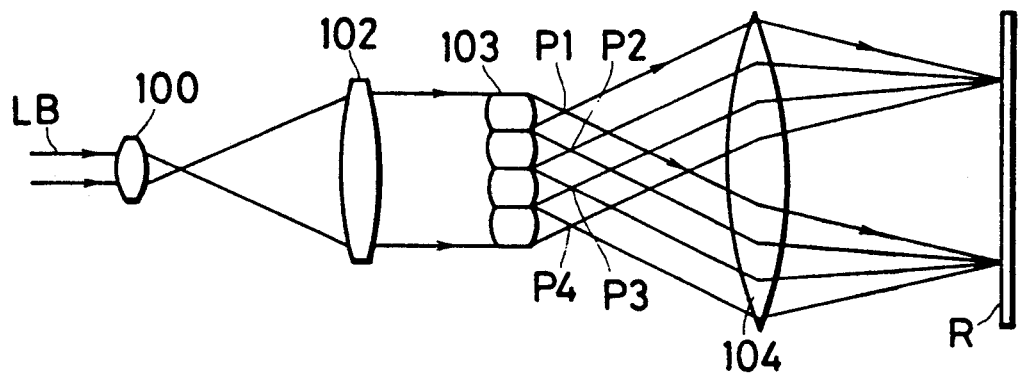
FIG. 3 is an optical path diagram useful for explaining the generation of interference patterns.
Figure 4:
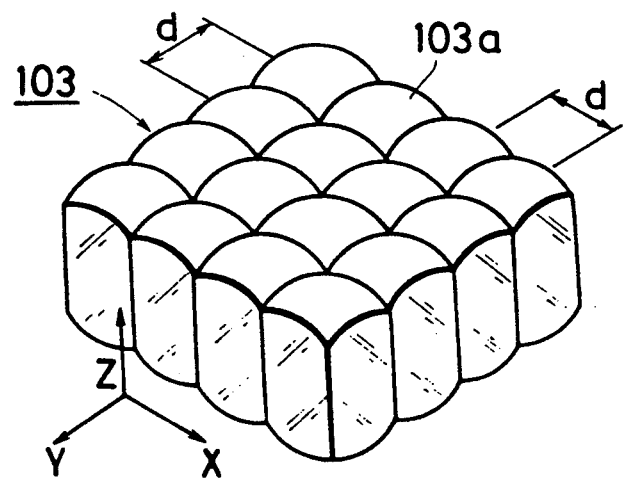
FIG. 4 is a perspective view of the fly-eye lens.

FIG. 3 shows schematically the arrangement of a beam expander (lenses 100 and 102) for expanding the beam LB from a laser light source to a given size, a fly-eye lens 103 forming illuminance distribution uniformizing means, a condenser lens 104 and a reticle R. FIG. 4 is a perspective view showing the construction of the fly-eye lens 103 including a plurality of element lenses 103a arranged in X and y directions, respectively, at a pitch d.

The collimated expanded beam emitted from the exit lens 102 of the beam expander falls substantially on the whole surface of the fly-eye lens 103. A group of secondary light sources (condensing points) $P_1$, $P_2$, $P_3$, $P_4$,---, which are equal in number to the element lens 103a, are formed on the exit side of the fly-eye lens 103. The light beams from the group of secondary sources $P_1$, $P_2$, $P_3$, $P_4$,--- are superposed on the reticle R by the condenser lens 104 thereby providing a uniform illumination. At this time, the light beams directed to the reticle R from the group of secondary sources $P_1$, $P_2$, $P_3$, $P_4$,--- interfere with one another simultaneously on the reticle R thereby producing interference patterns.

In this case, if the original beam LB generated from the laser generator has a sufficiently large size (or has a low spatial coherence), the beams from the group of secondary light sources $P_1$, $P_2$, $P_3$, $P_4$,--- become incoherent with one another thus producing no interference pattern. Conversely, if the original beam LB is very small in size (or high in spatial coherence), all of the beams from the group of secondary light sources $P_1$, $P_2$, $P_3$, $P_4$,--- interfere with one another producing high-contrast complicated interference patterns (light and dark bands) on the reticle R. On the other hand, if the original beam LB has a certain size, the mutual interference between the group of secondary light sources is reduced, that is, of the group of secondary light sources $P_1$, $P_2$, $P_3$, $P_4$,--- which are arranged at the pitch d only the respective adjacent light sources interfere with each other thereby producing interference patterns which are low in contrast and having sinusoidal intensity distributions.

The period of this sinusoidal wave will now be described. In FIG. 3, for the purposes of simplicity it is assumed that f represents the focal distance of the condenser lens 104 and that the group of secondary light sources $P_1$, $P_2$,--- and the reticle R surface are respectively arranged in the front and rear focal planes of the lens 104. The spacing between the light sources $P_1$, $P_2$,--- is the same with the spacing between the fly-eye lins elements or the pitch d.

Considering only the interference between the adjacent ones of the secondary light sources $P_1$, $P_2$,---, if the wavelength of the beams is represented as λ, the pitch of the interference patterns on the reticle R is given by (λ·f)/d and the interference patterns are further reduced on the wafer surface by an amount corresponding to the reduction ratio of the projection lens. In other words, the interference patterns generated on the illuminated plane have a periodic construction corresponding to the contruction of the fly-eye lens arranged as illuminance distribution uniformizing means.

As a result, assuming that the phase difference between the adjacent secondary light sources amounts to π, the interference pattern deviates by a half period (λ·f)/2d so that if the interference pattern having the phase difference of π radians with respect to the original interference pattern is superposed on the original interference pattern, the interference patterns compensate each other on the illuminated plane thus providing uniform illuminance. In other words, if the same periodic interference patterns are produced and superposed with a half-period displacement therebetween, the interference patterns can be eliminated on the illuminated plane.

In order that the phase difference between the adjacent secondary light sources may become π radians, it is necessary to arrange so that one of the two incident light beams to the fly-eye lens has its incident wavefront inclined relative to that of the other light beam and this angle of inclination θ is given as follows if the spacing of the fly-eye lens is represented by d;

$$\theta = \lambda/(2/d) = \lambda/2d$$

Next, a description will be made of the method of inclining the wavefronts of the two beams by λ/2d relative to each other. What is to be noted here is the fact that the inclined wavefronts do not interfere with each other. If they interfere with each other, another interference pattern is generated newly. In order to satisfy the required condition, it is necessary to use two polarized beams which are different in polarization (perpendicular to each other). While a variety of methods may be conceived for producing two polarized beams which are polarized in directions perpendicular to each other and having wavefronts inclined relative to each other, the most simple and stable method is to use a birefringent optical crystal prism. In other words, it is necessary to use a wedge-shaped prism whose edge line consists of a straight line in the same plane as the crystal optical axis of an anisotropic crystal such as quartz crystal, $MgF_2$, $ADP(NH_4H_2PO_4)$ or calcite.

Figure 5:
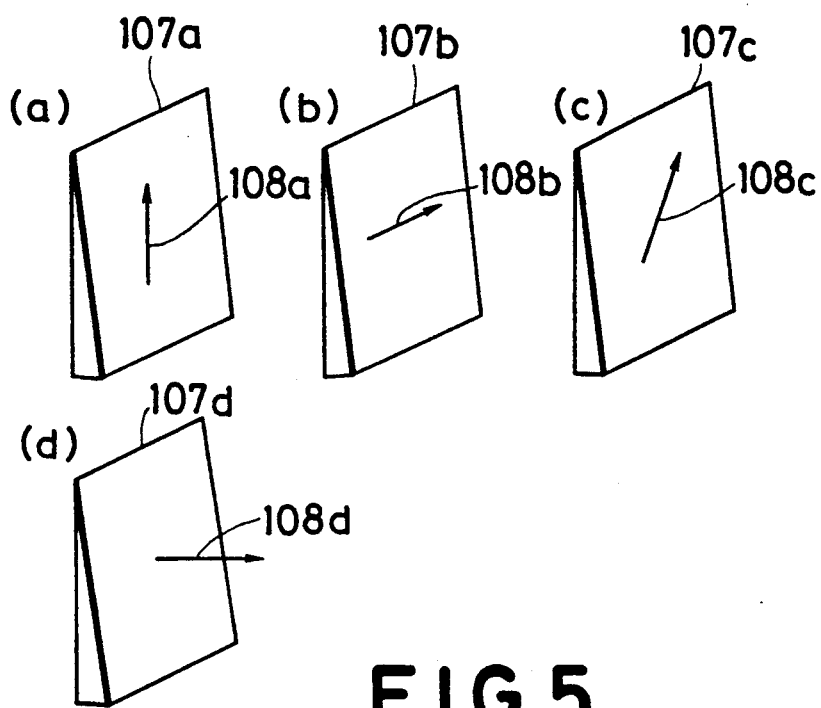
FIGS. 5a to 5d are perspective views showing various examples of the birefringent crystal prism.

A prism made from quartz crystal (uniaxial crystal) will now be described with reference to FIG. 5. In the Figure, shown in (a), (b) and (c) are examples in which optical axes 108a, 108b and 108c are respectively in the same plane with edge lines 107a, 107b and 107c of prisms thus satisfying the requirements of the present invention.

These prisms (a), (b) and (c) are appendant to the embodiments of the present invention, and have the function that separates an incident beam into two linearly polarized lights whose polarizing directions are perpendicular to each other and which emit with a predetermined difference angle.

The prism (d) cannot separate the incident beam into two linearly polarized components which are perpendicular to each other since an optical axis 108d is not in the same plane as the edge 107d. However, in the case where a prism is formed from the quartz crystal, an angle of the prism (d) is increased whereby the incident beam can be separated into circular polarized lights in which right- and left turn vectors are perpendicular to each other.

In the present invention, these polarizing prisms will suffice to have the function such that the incident beam is separated into two polarized luminous fluxes which are not interferred from each other and at the same time the exit angles of both the polarized luminous fluxes are made different from each other by a predetermined difference angle.

Generally, preferred are two linearly polarized lights whose polarizing directions are perpendicular to each other.

However, the beam may be separated into two elliptical polarized lights whose directions of a longer axis are perpendicular to each other or may be separated into two circular polarized lights whose rotational directions of polarization are opposite to each other.

That is, two polarized luminuous fluxes obtained from the polarizing prism in the present invention are two polarized components whose intensities are substantially the same and which occur no interference from each other.

These two polarized components are generally those in which an inner product of respective polarizing vectors is zero.

In other words, where (Ax·Ay) and (Bx·By) are the polarizing vectors of two polarized components, the following condition is fulfilled:

$$Ax^*·Bx + Ax·Bx^* + Ay^*·By + Ay·By^* = 0$$

wherein * represents the complex conjugation.

Optical polarizing elements fulfilled with the aforementioned condition include examples as shown in FIGS. 5(a), 5(b) and 5(c) which separate an incident light to two linear polarized lights, and another example as shown in FIG. 5(d) which separates an incident light to two circular polarized lights. Furthermore, an optical polarizing element adapted to separate an incident light to two luminous fluxes which are not interferred in intensity such as two elliptical polarized lights which are perpendicular to each other are also available. As to separate an incident light to two circular polarized lights in opposite direction to each other, an optical polarizing element comprising a combination of a right-handed quartz and a left-handed quartz known as a Cornushoed depolarizer can also be used. In this case, the light beam passed through the polarizing prism is separated into two luminous fluxes, a right-turn circular polarized light and a left-turn circular polarized light, and there is a difference in polarizing angle between the two luminous fluxes.

Therefore, this light beam can contribute to the decrease of interference fringes at the illuminated plane.

These elements are generally used as depolarization elements. As previously mentioned, a difference in polarizing angle between two polarized lights which are perpendicular to each other and reversed in rotational direction can be appropriately set to thereby reduce occurrence of interference fringes caused by a wave front division type optical integrator such as a fly-eye lens to render uniform illumination possible. The light passing through the birefringent crystal acts as a so-called wavelength plate since the former imparts a phase difference to the ordinary ray and extraordinary ray of polarized light.

In this case, the polarizing prism is not uniform in thickness in the overall surface but is different in thickness according to locations through which light passes.

Therefore, the passed light beam is different in the polarized condition according to the passing locations, and the incident light beam receives the quasi-depolarization effect. Of course, in this case, it is necessary that if the incident light is a linear polarized light, a crystal optical axis of the polarizing prism forms an angle of 45° with respect to the polarizing direction, and if the incident light beam is an elliptical polarized light, a crystal optical axis of the polarizing prism forms an angle of 45° with respect to the direction of a longer axis of the ellipse.

Figure 9:
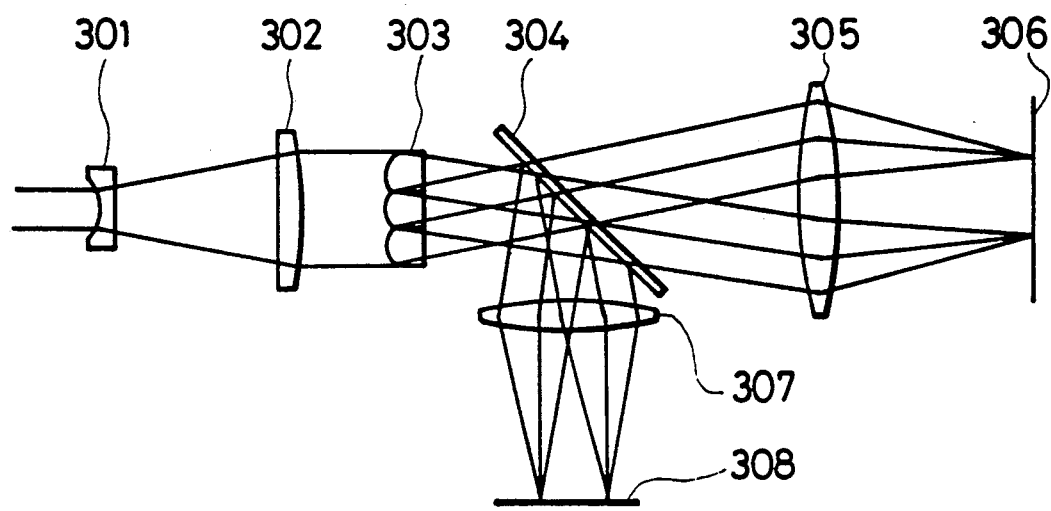
FIG. 9 is an optical path diagram showing essential parts of an optical system where exposure quantity controlled.

As the system for controlling the integrated exposure quantity of the illuminated plane, the structure of an optical system as shown in FIG. 9 is contemplated. Also in this case, if the light beam from the light source has a relatively strong polarized component in a specific direction, there arises a problem in that the accuracy of controlling the exposure quantity becomes low. That is, in FIG. 9, the light beam from the light source not shown is expanded in beam diameter by a beam expander comprising a pair of lenses 301 and 302, and the light beam is then divided into a plurality of partial luminous fluxes by a fly-eye lens 303.

These plural divided luminous fluxes are, on one hand, transmitted through a half-mirror 304 and are overlapped on an illuminated plane 306 by a condenser lens 305 thereby attaining a uniform illumination, and on the other hand, a part of the luminuous fluxes is reflected by the half-mirror 304 and is overlapped on a light quantity detection surface 308 by a further condenser lens 307. In this manner, the ratio of light quanities in the illuminated plane 306 and the light quantity detection surface 308 is measured in advance to render possible simultaneous detection of light quantity during the exposure operation. However, since the half-mirror 304 has the specific polarizing characteric, the polarized condition of the light beam from the light source becomes changed. Therefore, the ratio of light intensity between the illuminated plane 306 and the light quantity detection surface 308 changes, and as a result, the accurate exposure quantity control cannot be made.

The optical polarizing elements applied to the illumination arrangement in the present invention imparts the quasi-depolarization effect to the incident light beam. Therefore, even in the exposure quantity detection system including the half-mirror as mentioned above, the accurate exposure quantity control can be achieved.

Figure 6:
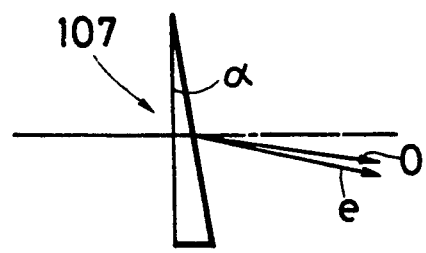
FIG. 6 is an optical path diagram showing the separation of the beam by the birefringent crystal prism.

When the prisms as shown in FIGS. 5(a), 5(b) and 5(c) receive the composite lights different in the polarizing direction, or the linear polarized light having a polarizing angle of 45° with respect to the direction of the crystal optical axis, or the elliptical polarized light or circular polarized light in which the principal axis is inclined at an angle of 45° with respect to the direction of the crystal optical axis, the beam passed through the prisms is refracted in two directions as shown in FIG. 6. In this case, the angle of refraction is $(n_e - 1)\alpha$ with respect to the o polarized light (ordinary ray: light in which the polarized direction or vibration direction of light is at right angles to the optical angle), and $(n_e - 1)\alpha$ with respect to the e polarized light (extraordinary ray light which is polarized or vibrated in a direction parallel with the optical axis). Where, $n_o$ represents the refractive index of the o polarized light ($n_o = 1.6032$); $n_e$ the refractive index of the e polarized light ($n_e = 1.6144$); and $\alpha$ the vertex angle of the prism. The o polarized light and the e polarized light separated by the birefringent crystal prisms as shown in FIGS. 5(a), 5(b) and 5(c) have their wave front forming an angle of $(n_e - n_o)\alpha$ and are not interferred from each other.

The method of determining the vertex angle of such prism will now be explained. The following equation (1) shows the conditions required for displacing by a half period the interference patterns produced by the o and e polarized rays on the illuminated plane $$(n_o - n_o)\alpha = \lambda/2d \qquad (1)$$

In equation (1), if the wavelength $l=248$ nm and the spacing $d=4$ mm for the element lenses forming the fly-eye lens, we obtain $$\lambda/2d = (248 \times 10^{-9})/(2 \times 4 \times 10^{-3}) = 31 \mu rad \approx 6.4''$$

Therefore
$$\alpha = (\lambda/2d)/(n_e - n_o) = (31 \times 10^{-6})/(1.6144 - 1.6032)$$

and $$\alpha \approx 2.768m \ rad \approx 0.1586° \approx 9.5'$$

Thus, it is necessary to use a crystal prism having a vertex angle of 9.5'.

It is to be noted that while, in the above-described embodiment, the prism is arranged on the incident side of the fly-eye lens, the polarizing means of this invention need not always be arranged on the incident side of the illuminance distribution uniformizing means. In other words, since the period of interference patterns is primarily determined by the wavelength $\lambda$ and the pitch d of the fly-eye lens as mentioned previously, the prism may be arranged at any position in the optical path provided that the vertex angle of the prism is selected suitably.

Referring now to FIG. 7, a description will be made of the method for determining the vertex angle of a prism when a pair of fly-eye lenses are used for the purpose of improving the uniformity of the illumination by the laser beam (corresponding to the case of the embodiment shown in FIG. 1).

Firstly, where a crystal prism is arranged in the front (the incident side) of a second-stage fly-eye lens 205, it is necessary to use a prism having a vertex angle of 9.5' ($\lambda = 248$ nm, d=4 mm) as mentioned previously. On the other hand, where the prism is arranged in front of a first-stage fly-eye lens 203 as shown in FIG. 7, the inclinations of the wavefronts are decreased by an amount corresponding to the reciprocal of the magnification due to the first-stage fly-eye lens 203 and a convex lens 204. Therefore, the vertex angle of the prism must be increased by an amount corresponding to this magnification. Since this magnification is generally on the order of 10 times, the vertex angle of the crystal prism becomes $9.5' \times 10 = 95' = 1°35'$ so that the separation angle between the o and e polarized beams becomes about 64".

In this case, the direction of movement of the beam on the whole is shifted by about $95' \times (1.6-1) = 57'$ from the direction of movement before its incidence to the crystal prism 207 so that if necessary, an optical path correction prism 209 (the refractive index is about 1.51 and the vertex angle is 1°50') which is made for example from a synthetic silica may be arranged side by side with the crystal prism 207 as shown in FIG. 7 so as to correct the directions of movement of the beams to incline with the same angle to the both sides of the optical path as shown in FIG. 8. By so doing, the bisector of the angle formed by the o and e polarized beams passed through the correction prism 209 coincides with the direction of movement of the beam prior to its incidence to the prism.

It is to be noted that while, in the above-mentioned case, the pair of fly-eye lenses are used, the invention is not limited to it and it is needless to say that if any optical magnification is applied between the fly-eye lens and the prism forming polarizing means, the angle of the prism must be similarly increased by an amount corresponding to the magnification.

While in FIG. 8, the correction prism 209 made of a synthetic quartz is used, it is to be noted that the correction prism 209 may be replaced by a birefringent polarizing prism whose optical axis is arranged to the direction perpendicular to the optical axis of the polarizing prism 207.

As described above, the polarizing prism formed of a birefringent optical crystal material has two effects, one for reducing the coherence and the other for obtaining the, depolarization effect, both of which are apparently consistent with each other.

While in the foregoing, the lens elements of the fly-eye lens are arranged with the pitch d in both X and Y directions, it is to be noted that in the following description, a plurality of element lenses 103a arranged with pitches a and b in X and Y directions respectively. The pitches a and b are in the relation of $a \leq b$.

Furthermore, while in the foregoing, the direction of the polarizing angle caused by the polarizing prism has been described in connection with the pitch direction of one of the plurality of lens elements, it is to be noted that the same is true for the pitch direction of the others. Actually, the polarizing angle is directed at the synthesized direction according to the size of both the pitches a and b.

In the following, in the case of using a two-dimentionally arranged fly-eye lens and a laser beam having a polarized characteristic, a description will be made of the way of applying a difference of polarizing angle between two polarized luminous fluxes to the diagonal direction of the emitting surfaces of the lens elements of the fly-eye lens.

Figure 10:
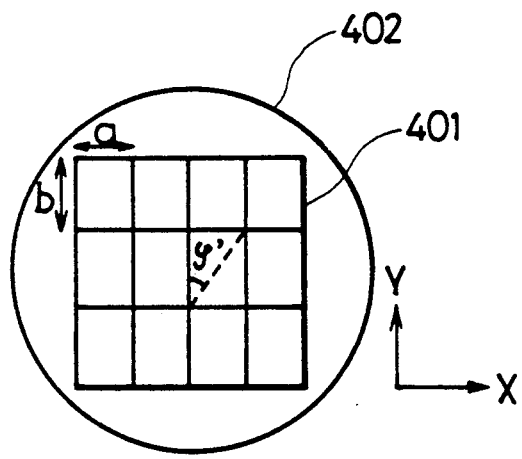
FIG. 10 is a schematic view of the overlapping between a fly-eye lens as an optical integrator and a polarizing prism within the illumination optical arrangement according to the present invention, as viewed in an direction of an optical axis.

FIG. 10 is a schematic view in which the overlapping of a fly-eye lens 401 and a polarizing prism 402 within the illumination optical arrangement according to the present invention is viewed in a direction of an optical axis. The fly-eye lens 401 has the structure in which a plurality of lens elements having a rectangular incident and exit plane are bundled, and the lengths of sides of the rectangle of the incident and exit plane of the individual lens element are that the short side along the axis x on the x-y rectangular coordinates is a, the long side along the axis y is b, and the diagonal line of the rectangle is at an angle of with respect to the axis y.

Figure 11:
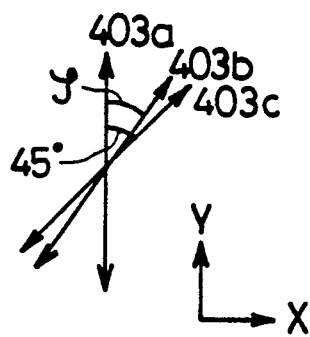
FIG. 11 is an explanatory view showing the relationship between a polarizing direction of an incident laser beam as viewed in a direction of an optical axis, an aimed polarizing direction of an exit light caused by a polarizing prism and a direction of a crystal optical axis of the polarizing prism.
Figure 12:
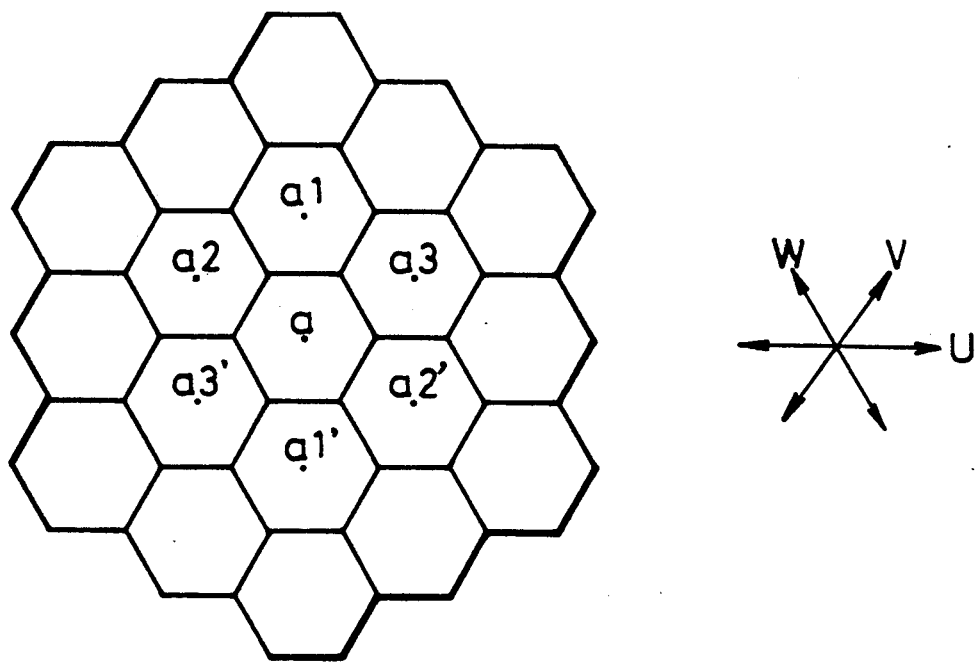
FIG. 12 is a schematic view of a fly-eye lens comprising a bundle of hexagonal lens elements as viewed in a direction of an optical axis.

FIG. 11 shows the relationship, with reference to the x-y coordinates similar to FIG. 10, between a polarized direction 403a of the incident laser beam as viewed in a direction of an optical axis, an aimed polarizing direction 403b of the exit light caused by the polarizing prism 402, and a crystal optical axis direction 403c of the polarizing prism 402.

In the case where the coherence of the incident laser beam is strong in both x and y directions and grating-like interference fringes occur on the illuminated plane, it is necessary that as shown in FIG. 11, the aimed polarizing direction 403b is made so as not to register with both the x and y axes whereby the grating-like interference flinges caused by the polarized beams separated into two portions emitted from the polarizing prism 402 are deviated in both x and y directions from each other on the illuminated plane. It is to be noted that in the case where the coherence of the incident laser beam is strong in either x or y axis direction, the aimed polarizing direction 403b may be determined in connection with one axis direction which is strong in the coherence. It is to be noted in this case that the polarizing angle is provided also in the other axis direction so that the aimed polarizing direction 403b is set not to be coincided with any of x and y axes. In either case, as for the deviation of the interference fringes on the illuminated plane, convex and concave portions of distribution of light intensity are filled up each other to make illumination even.

In order that the aimed polarizing direction 403b is not coincided with any of x and y axes, it is necessary that for example, an angle of 45° is formed between the crystal optical axis direction 403c of the polarizing prism 402 and the polarized direction 403a of the incident laser beam. In the case where the incident laser beam is an elliptical polarized light, the polarized direction 403a means the direction of the longer axis of the ellipse.

Assuming that in the case where as the polarizing prism 402, a crystal polarizing prism is used similarly to the example mentioned in connection with FIG. 6, a difference between the refractive index $n_o$ with respect to the e polarized light and the refractive index $n_o$ with respect to the o polarized light is $n_e - n_o = 0.0112$, a difference of polarizing angle between the o polarized light and the e polarized light is a fine angle. They can be represented by the following:

In the x direction: $\theta_x = \lambda(n+\frac{1}{2})/a$

In the y direction: $\theta_y = \lambda(m+\frac{1}{2})/b$ wherein n and m are the integer.

Accordingly, the synthesized difference angle in x and y directions is generally given by $$\theta = \lambda \cdot \{[(n+\tfrac{1}{2})/a]^2 + [(m+\tfrac{1}{2})/b]^2\}^{\frac{1}{2}}$$

wherein $\lambda$ is the wavelength of the incident laser beam.

At this time, the polarizing direction is the direction at an angle of $$\psi = \tan^{-1}\{[(n+\tfrac{1}{2})/a] + [(m+\tfrac{1}{2})/b]\}$$

with respect to the longer side of the dimension b when the fly-eye lens 402 is viewed in the optical axis direction.

The integers n and m are suitably determined. For example, considering the case of n=m=0, there obtains the following:

$$\theta = \lambda\{[1/a^2 + 1/b]^2\}^{\frac{1}{2}}/2$$

$$\psi = \tan^{-1}(b/a)$$

Because of $\psi = \tan^{-1}(b/a)$, the $\psi'$ shown in FIG. 10 is in the relation of $\psi + \psi' = 90$ (deg).

Accordingly, when an angle between the diagonal direction of the laser element of the fly-eye lens 401 and the y axis is $\psi'$, the polarizing direction 403a caused by the polarizing prism 402 forms an angle $\psi$ with respect to the y axis, that is, an angle of $\psi'$ with respect to the x axis.

However, in the case where the interference fringes on the illuminated plane are only longitudinal fringes or lateral fringes because the coherence of the incident laser beam is strong only in either x or y direction, a polarizing angle is given only in the direction in which the coherence in the x or y direction is strong.

While as the fly-eye lens 401, an example of the lens in which the incident and exit plane of the lens element has a rectangle has been mentioned, a fly-eye lens having a hexagonal incident and exit plane shape may be used.

It is also needless to say that the above-described embodiments of the present invention are illustrative only and many changes and modifications may be made thereto without departing from the scope of the invention as defined by the appended claims.

What is claimed is:

1. An illumination optical arrangement comprising:
   (a) light source means for emitting a coherent light beam;
   (b) optical illuminance distribution uniformizing means for making substantially uniform an intensity distribution in a beam cross-section of illumination by said coherent light beam in a plane to be illuminated; and
   (c) optical polarizing means for producing from said coherent light beam a plurality of polarized light components which are different in polarization direction from each other in such a manner that wave fronts of incident light beams of said polarized light components to said optical illuminance distribution uniformizing means are respectively inclined relative to each other whereby interference patterns produced by said polarized light components are relatively shifted in position in said illuminated plane, thus said polarized light components do not interfere with each other.

2. An illumination optical arrangement comprising:
   (a) light source means for emitting a coherent light beam;
   (b) optical illuminance distribution uniformizing means for making substantially uniform an intensity distribution in a beam cross-section of illumination by said coherent light beam in a plane to be illuminated wherein said optical illuminance distribution uniformizing means comprises optical means for producing from said coherent light beams a group of different secondary light sources which are spatially periodically distributed in a plane containing a beam cross-section of said coherent light beam, and lens means for superposing light beams from said secondary light sources in one plane to be illuminated; and
   (c) optical polarizing means for producing from said coherent light beam a plurality of polarized light components which are different in polarization direction from each other in such a manner that wave fronts of incident light beams of said polarized light components to said optical illuminance distribution uniformizing means are respectively inclined relative to each other whereby interference patterns produced by said polarized light components are relatively shifted in position in said illuminated plane.

3. An illumination optical arrangement according to claim 1, wherein said optical illuminance distribution uniformizing means has a spatially periodic construction in said plane containing said beam cross section, and wherein said optical polarizing means produces from said coherent light beam said two polarized light components which are perpendicular to each other in such a manner that wavefronts of incident light beams of said polarized light components to said optical illuminance distribution uniforming means are inclined relative to each other whereby interference patterns produced by said polarized light components are shifted in spatial period by a half period from each other in said illuminated plane.

4. An illumination optical arrangement according to claim 1, wherein said optical polarizing means includes birefringent crystal prism means of a predetermined shape arranged in an optical path.

5. An illumination optical arrangement according to claim 1, further comprising means for spatially vibrating the illuminating position of said beam on said illuminated plane in said beam cross-section.

6. An exposure apparatus for the manufacture of integrated circuits, which includes an illumination optical arrangement comprising:
   (a) light source means for emitting a coherent light beam;
   (b) optical illuminance distribution uniformizing means for making substantially uniform an intensity distribution in a beam cross-section of illumination by said coherent light beam in a plane to be illuminated; and
   (c) optical polarizing means for producing from said coherent light beam a plurality of polarized light components which are different in polarization direction from each other in such a manner that wave fronts of incident light beams of said polarized light components to said optical illuminance distribution uniformizing means are respectively inclined relative to each other whereby interference patterns produced by said polarized light components are relatively shifted in position in said illuminated plane, thus said polarized light components do not interfere with each other.

7. In an illumination optical arrangement in which a beam emitted from a laser light source is projected onto an object to be illuminated through illuminance distribution uniformizing means for adjusting substantially uniform an intensity distribution in a cross-section of said beam, the improvement comprising:
   optical polarizing means separating said beam into two beams of polarized light components which are perpendicular to each other in such a manner that interference patterns produced on an illuminated surface of said object by said polarized light components are spatially displaced by a half period from each other, thus said polarized light components do not interfere with each other.

8. An illumination optical arrangement comprising:
   (a) light source means for emitting a coherent light beam;
   (b) beam expanding means for expanding said coherent light beam in diameter;
   (c) illuminance distribution uniformizing means for adjusting substantially uniform an intensity distribution in a beam cross-section of said expanded coherent light beam; and
   (d) optical polarizing means for producing from said expanded coherent light beam two polarized light components which are perpendicular to each other in a manner that wave fronts of incident light beams of said polarized light components to said optical illuminance distribution uniformizing means are inclined relative to each other whereby interference patterns produced by said polarized light components compensate each other in one illuminated plane, thus producing no mutual interference with each other.

9. An illumination optical arrangement comprising:
   (a) light source means for emitting a coherent light beam;
   (b) beam expanding means for expanding said coherent light beam in diameter;
   (c) illuminance distribution uniformizing means for adjusting substantially uniform an intensity distribution in a beam cross-section of said expanded coherent light beam wherein said optical illuminance distribution uniformizing means includes optical means for producing from said coherent light beam a group of different secondary light sources which are spatially periodically distributed in a plane containing a beam cross-section of said coherent light beam, and lens means for superposing light beams from said secondary light sources in one illuminated plane;
   (d) optical polarizing means for producing from said expanded coherent light beam two polarized light components which are perpendicular to each other in a manner that wave fronts of incident light beams of said polarized light components to said optical illuminance distribution uniformizing means are inclined relative to each other whereby interference patterns produced by said polarized light components compensate each other in one illuminated plane.

10. An illumination optical arrangement according to claim 8, wherein said optical illuminance distribution uniformizing means has a spatially periodic construction in said plane containing said beam cross section, and wherein said optical polarizing means forms from said coherent light beams said two polarized light components which are perpendicular to each other in such a manner that wavefronts of incident light beams of said polarized light components to said optical illuminance distribution uniforming means are inclined relative to each other whereby interference patterns produced by said polarized light components are relatively displaced in spatial period by a half period in said illuminated plane.

11. An illumination optical arrangement according to claim 8, wherein said optical polarizing means includes birefringent crystal prism means of a predetermined shape arranged in an optical path.

12. An illumination optical arrangement according to claim 8, further comprising means for spatially vibrating the illuminating position of said beam on said illuminated plane in said beam cross-section.

13. An illumination optical arrangement for an exposure apparatus whereby a pattern on an object placed in a plane to be illuminated is projected onto a surface to be exposed through an objective lens, said arrangement comprising:
   (a) light source means for emitting a coherent light beam;
   (b) beam expanding means for expanding said coherent light beam in diameter;
   (c) illuminance distribution uniformizing means for adjusting substantially uniformly an intensity distribution in a beam cross-section of said expanded coherent light beam, said optical illuminance distribution uniformizing means including optical means for producing from said expanded coherent light beam a group of different secondary light sources which are spatially periodically distributed in a plane containing the beam cross-section of said expanded coherent light beam, and condenser lens means for superposing light beams from said secondary light sources in said illuminated plane; and (d) optical polarizing means for producing from said expanded coherent light beam two polarized light components which are perpendicular to each other in such a manner that wavefronts of incident light beams of said polarized light components to said optical illuminance distribution uniformizing means are inclined relative to each other whereby interference patterns produced by said polarized light components compensate each other in said illuminated plane, thus said polarized light components do not interfere with each other.

14. An illumination optical arrangement according to claim 13, wherein said optical polarizing means includes birefringent crystal prism means of a predetermined shape arranged in an optical path.

15. An illumination optical arrangement according to claim 13, further comprising means for spatially vibrating the illuminating position of said beam on said illuminated plane in said beam cross-section.

16. An illumination optical arrangement comprising:
(a) light source means for emitting a coherent light beam;
(b) optical illuminance distribution uniformizing means for making substantially uniform an intensity distribution in a beam cross-section of illumination by said coherent light beam in a plane to be illuminated;
(c) said optical illuminance distribution uniformizing means including a plurality of lens elements arranged substantially in a matrix manner and each having a pair of incident and exit planes in the form of a right-angle tegragon respectively;
(d) optical polarizing means for producing two polarized light components in which an inner product of respective polarized vectors is zero and inclining a respective of wave fronts said polarized light components incident to said optical illuminance distribution uniformizing means in relative to each other such that a respective of interference patterns produced by said polarized light components are relatively shifted in position in said illuminated plane; and (e) said optical polarizing means having an optical construction parameter so determined that where a and b (a≦b) are the dimensions of the length of two sides of the tegragon, a difference angle between the polarizing angles of the two polarized luminous fluxes is given by $$\theta = \lambda \{[(n+\tfrac{1}{2})/a]^2 + [(m+\tfrac{1}{2})/b]^2\}^{\tfrac{1}{2}}$$

wherein λ represents the wavelength, n and m represent the integer, and when the fly-eye lens is viewed in a direction of its optical axis, said difference angle between the polarizing angles is formed at an angle ψ expressed by:

$$\psi = \tan^{-1}\{[(n+\tfrac{1}{2})/a]/[(m+\tfrac{1}{2})/b]\}$$

with respect to said b.

17. An illumination optical arrangement according to claim 16, wherein said optical polarizing means includes a polarizing prism formed of a birefringent optical material inserted into an optical path.

18. An illumination optical arrangement according to claim 17, wherein said coherent light beam has a polarizing characteristic, and said polarizing prism is formed of a birefringent optical material having an optical crystal axis which forms an angle of 45° with respect to the polarized direction of said polarized coherent light beam as viewed from a direction of an optical axis of said beam.

* * * * *